United States Patent
Matsubara

[11] Patent Number: 5,897,365
[45] Date of Patent: Apr. 27, 1999

[54] PROCESS OF FABRICATING SEMICONDUCTOR DEVICE HAVING LOW-RESISTIVE TITANIUM SILICIDE LAYER FREE FROM SHORT-CIRCUIT AND LEAKAGE CURRENT

[75] Inventor: Yoshihisa Matsubara, Tokyo, Japan

[73] Assignee: NEC Corporation, Tokyo, Japan

[21] Appl. No.: 08/883,333

[22] Filed: Jun. 26, 1997

[30] Foreign Application Priority Data

Jun. 27, 1996 [JP] Japan .................................. 8-167671

[51] Int. Cl.⁶ ................ H01L 21/3205; H01L 21/4763; H01L 21/44
[52] U.S. Cl. ........................ 438/592; 438/649; 438/682
[58] Field of Search ................................ 438/592, 649, 438/583, 651, 655, 664, 682, FOR 360

[56] References Cited

U.S. PATENT DOCUMENTS

| | | | |
|---|---|---|---|
| 5,510,292 | 4/1996 | Hayashi | 437/137 |
| 5,721,175 | 2/1998 | Kunishima et al. | 438/542 |
| 5,744,395 | 4/1998 | Shue et al. | 438/305 |
| 5,792,684 | 8/1998 | Lee et al. | 438/238 |

OTHER PUBLICATIONS by Y. Matsubura et al., "TiN–capped $TiSi_2$ formation in W/$TiSi_2$ process for a quater–micron complementary metal–oxide–semiconductor" *Thin Solid Films 253*, 1994, pp. 395 to 401, Month Unknown.

*Primary Examiner*—John F. Niebling
*Assistant Examiner*—Christopher Lattin
*Attorney, Agent, or Firm*—Young & Thompson

[57] ABSTRACT

Upon completion of a sputtering for a titanium layer, the titanium layer is taken out from the sputtering system, and a surface portion of the titanium layer is oxidized in the atmosphere; the titanium oxide layer is evaporated in fluoride gas atmosphere so as to prevent the titanium layer from the oxygen, and aggregation hardly takes place during silicidation of the titanium layer so that the titanium silicide layer is decreased in resistivity.

13 Claims, 7 Drawing Sheets

PROCESS OF FABRICATING SEMICONDUCTOR DEVICE HAVING LOW-RESISTIVE TITANIUM SILICIDE LAYER FREE FROM SHORT-CIRCUIT AND LEAKAGE CURRENT

FIELD OF THE INVENTION

This invention relates to a process of fabricating a semiconductor device and, more particularly, to a process of fabricating a semiconductor device having a low-resistive titanium silicide layer free from a short-circuit and leakage current.

DESCRIPTION OF THE RELATED ART

The circuit elements of the semiconductor integrated circuit device have been miniaturized. A semiconductor memory device and a semiconductor logic device are now designed under the minimum line width between 0.15 micron and 0.25 micron. For example, a conductive wiring such as a gate electrode is decreased in not only the line width but also the thickness. However, the miniaturization of conductive wiring gives rise to increase the resistance along the wiring, and the signal delay becomes serious. One of the solution is to use low-resistive conductive material. Refractory metal silicide is so low in resistivity that the manufacturer employs the refractory metal silicide in semiconductor integrated circuit devices.

A salicide (self-aligned-silicide) technology is attractive for the semiconductor device manufacturers. Refractory metal is deposited over a bulk silicon or a polysilicon layer, and the refractory metal and the silicon reacts with each other so as to form a refractory metal silicided in a self-aligned manner. Titanium is a typical example of the refractory metal, and the titanium salicide technology is one of the key technologies for the miniature field effect transistors for the semiconductor integrated circuit devices.

When the salicide technology is applied to an impurity region formed in a silicon substrate as a source/drain region of a miniature field effect transistor, it is necessary to suppress the diffusion of dopant impurity so as to prevent the miniature field effect transistor from a short channel effect. However, if the junction of the impurity region and the refractory metal silicide form a boundary, leakage current is increased due to crystal defect, and destroys the switching action of the miniature field effect transistor. Thus, when the impurity region becomes shallower, it is necessary to make the refractory metal silicide layer thin.

FIGS. 1A to 1D illustrates a typical example of the prior art process for fabricating a MOS transistor with the titanium salicide. The prior art process starts with preparation of a silicon substrate 1 of one conductivity type. A thick field oxide layer 1b is selectively grown by using the LOCOS (local oxidation of silicon) technology, and defines an active area in the major surface of the silicon substrate 1a. Dopant impurity may have been introduced under the thick field oxide layer 1b so as to form a channel stopper beneath the thick field oxide layer 1b.

The silicon in the active area is thermally oxidized, and a thin gate oxide layer 2a is grown on the silicon substrate 1a. Polysilicon is deposited to 150 nanometers thick over the entire surface of the resultant semiconductor structure by using a chemical vapor deposition, and a polysilicon layer extends over the thin gate oxide layer 2a and the thick field oxide layer 1b. Phosphorous is doped into the polysilicon layer, and an appropriate photo-resist etching mask is formed on the phosphorous-doped polysilicon layer. Using the photo-resist etching mask, the phosphorous doped polysilicon layer is patterned into a polysilicon strip 2b for a gate electrode.

Silicon oxide is deposited over the entire surface of the resultant semiconductor structure, and the polysilicon strip 2b and the gate oxide layer 2a are covered with a silicon oxide layer. The silicon oxide layer is anisotropically etched away without an etching mask, and side wall spacers 2c are formed on both side surfaces of the polysilicon strip 2b. While the silicon oxide layer is being anisotropically etched, the thin gate oxide layer 2a on both sides of the polysilicon strip 2b are concurrently etched away, and the silicon substrate 1a is exposed to the gaps between the side wall spacers 2c and the thick field oxide layer 1b.

Dopant impurity of the opposite conductivity type is ion implanted into the resultant semiconductor structure without an ion-implantation mask, and is activated during an annealing at 800 degrees to 1000 degrees in centigrade. As a result, source and drain regions 2d/2e are formed in the active area.

Subsequently, titanium is deposited to 50 nanometers thick over the entire surface of the resultant semiconductor structure by using a sputtering, and a titanium layer 3a extends over the thick field oxide layer 1b, the source and drain regions 2d/2e, the side wall spacers 2c and the polysilicon strip 2b. When the resultant semiconductor structure is taken out from the sputtering system, a surface portion of the titanium layer 3a is oxidized in the atmosphere, and the titanium layer 3a is overlain by a titanium oxide layer 3b as shown in FIG. 1A. The titanium oxide layer 3b is of the order of 5 nanometers thick, and is expressed as $TiO_x$ where x ranges between 1 and 2.

Subsequently, the resultant semiconductor structure is placed in a lamp annealing system, and a first annealing is carried out in nitrogen atmosphere at 600 degrees to 650 degrees in centigrade for 30 seconds to 60 seconds. The titanium on the polysilicon strip 2b and the titanium on the source and drain regions 2d/2e react with the polysilicon/silicon, and titanium silicide strips 2f/2g/2h are produced in a self-aligned manner with the polysilicon strip 2b and the source and drain regions 2d/2e. The titanium silicide has high-resistive C49 crystal structure. The titanium oxide 3b is nitrided during the first annealing, and oxygen-containing titanium layers 3c are left on the thick field oxide layer 1b and the side wall spacers 2c. The oxygen containing titanium layers 3c and the titanium silicide layers 2f/2g/2h are covered with a titanium nitride layer 3d as shown in FIG. 1B.

Subsequently, the oxygen-containing titanium layers 3c are etched away by using mixture of aqueous ammonia, pure water and hydrogen peroxide as shown in FIG. 1C. The titanium nitride layer 3d is lifted off together with the oxygen-containing titanium layers 3c.

Finally, a second annealing is carried out at 850 degrees in centigrade in the nitrogen atmosphere at the atmospheric pressure for 60 seconds. The titanium silicide layer are converted from the high-resistive C49 crystal structure 2f/2g/2h to low-resistive C54 crystal structure 2f'/2g'/2h' as shown in FIG. 1D.

Thus, the two-layered low-resistive conductive paths 2b/2f', 2d/2g' and 2e/2h' are formed through the salicide process. However, the low-resistive two-layered conductive paths are still high in sheet resistance, and undesirable short-circuit takes place.

The first problem is derived from the aggregation of the titanium silicide. As described hereinbefore, the titanium silicide layer 2f'/2g'/2h' are produced from the oxygen-containing titanium, and the oxygen causes the phase transition temperature from C49 crystal structure to C54 crystal structure to be rise as already reported by the present inventor in "TiN-capped TiSi$_2$ formation in W/TiSi$_2$ process for a quarter-micron complementary metal-oxide-semiconductor", Thin Solid Films 253, 1994, pages 395 to 401. FIG. 2 illustrates the relation between the change rate of the phase transition and the temperature in the second annealing. Plots PL1 represents a titanium layer of 50 nanometers thick capped with a titanium oxide layer of 4 nanometers thick. On the other hand, plots PL2 represent titanium layers of 10 nanometers thick, and the titanium oxide cap layer is different in thickness. As will be understood from comparison between plots PL1 and PL2, when the titanium layer is decreased in thickness, the phase transition temperature is increased. Plots PL2 teaches that the phrase transition temperature is increased together with the thickness of the titanium oxide cap layer. For example, when the titanium oxide layer over the titanium layer of 10 nanometers thick is increased from 1 nanometer thick to 4 nanometers thick, the phase transition temperature is increased by about 30 degrees in centigrade.

On the other hand, the titanium silicide is aggregated around 900 degrees in centigrade, and the aggregation is causative of undesirable disconnection or discontinuity. When the phase transition temperature is increased, the margin to the aggregating temperature is decreased, and a continuous titanium silicide layer of C54 crystal structure is hardly formed. Moreover, the titanium silicide layers still contain oxygen. This results in the large sheet resistance of the two-layered conductive paths 2b/2f', 2d/2g' and 2e/2h'.

The second problem is derived from the residual titanium nitride layer 3d. While the resultant semiconductor structure is being subjected to the first annealing, the titanium oxide layer 3b is reduced, and is converted to the titanium nitride. The oxygen is dissociated from the titanium oxide, and part of the oxygen is diffused into the titanium layer 3a of the C49 crystal structure in the snowplow-effect. The etchant has a large selectivity to the titanium rather than the titanium nitride and the titanium silicide, and the titanium nitride is lifted off during the etching. However, when the oxygen is diffused in the titanium, the selectivity of the etchant is decreased, and the titanium layer 3c is liable to remain together with the titanium nitride layer 3d. Although the titanium nitride layers 3d remain on the titanium silicide layer 2f/2g/2h, these titanium nitride layers 3d per se are not trouble to the field effect transistor. However, the silicon nitride layer 3d and the titanium layer 3c on the field oxide layer 1b and the side wall spacers 2c are causative of leakage and the short-circuit between the conductive layers isolated by the side wall spacers 2c or the thick field oxide layer 1b.

It is possible to etch the titanium nitride layers 3d. However, etchants available for the etching have a low-selectivity between the titanium nitride and the titanium silicide, and a substantial amount of titanium silicide is concurrently etched away so that the resistance of the conductive signal path is not decreased so wide as being expected.

SUMMARY OF THE INVENTION

It is therefore an important object of the present invention to provide a process of fabricating a semiconductor device a titanium silicide layer of which is low in resistivity and free from a short-circuit and leakage current.

To accomplish the object, the present invention proposes to remove a titanium oxide layer through an evaporation of titanium fluoride covered from the titanium oxide.

In accordance with the present invention, there is provided a process of fabricating a semiconductor device comprising the steps of: a) preparing a semiconductor structure having at least one silicon layer and an insulating layer; b) covering the silicon layer and the insulating layer with a titanium layer, the titanium layer being unintentionally oxidized so as to be coated with a titanium oxide layer; c) annealing the resultant structure of the step b) in a first atmosphere containing fluoride gas so as to evaporate titanium fluoride produced from the titanium oxide layer and to produce an oxygen-free high-resistive titanium silicide layer from the titanium layer in a self-aligned manner with the silicon layer; d) removing residual titanium on the insulating layer from the resultant structure of the step c); and e) annealing the resultant structure of the step d) in a second atmosphere higher than the first atmosphere so as to convert the oxygen-free high-resistive titanium silicide layer to an oxygen-free low-resistive titanium silicide layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
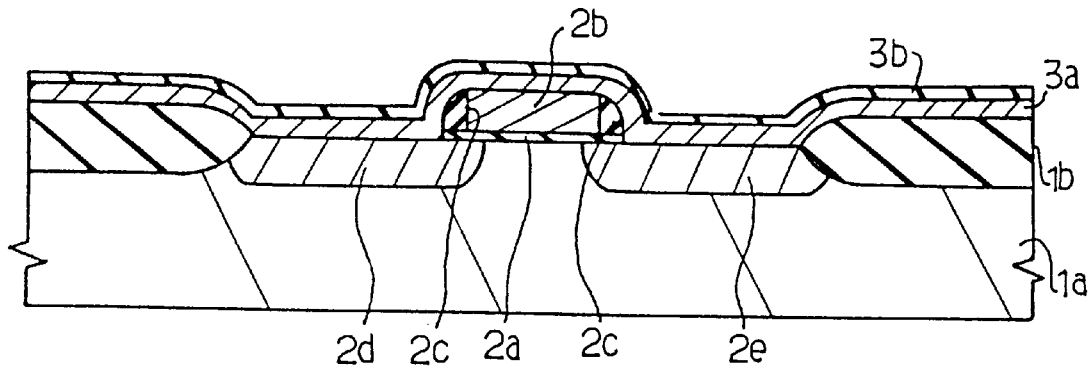
FIGS. 1A to 1D are cross sectional views showing the prior art process of fabricating a MOS transistor with the titanium salicide structure.
Figure 1B:
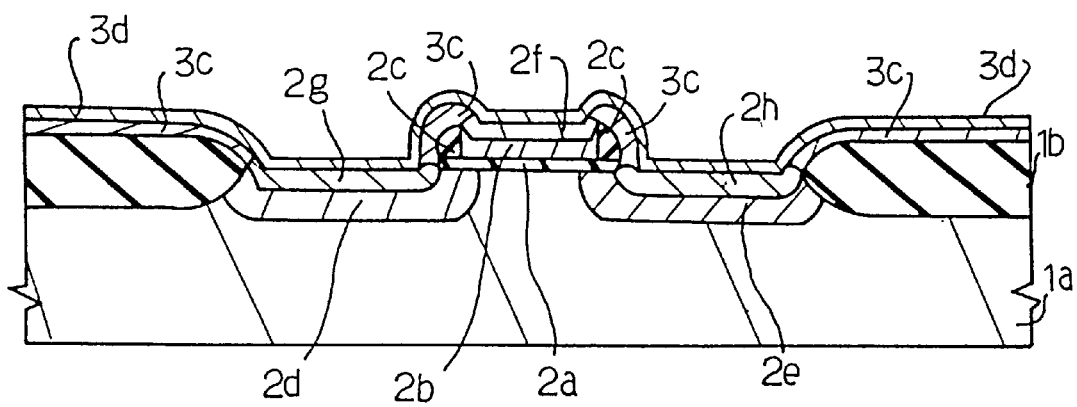
Figure 1C:
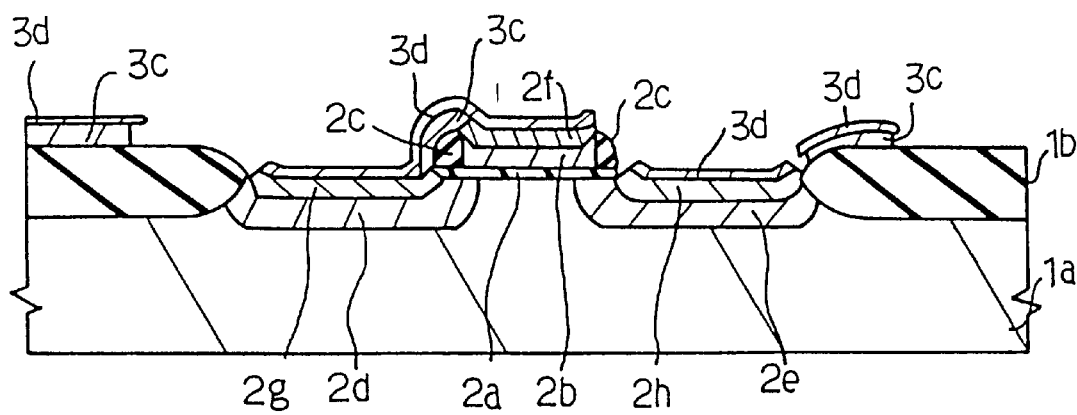
Figure 1D:
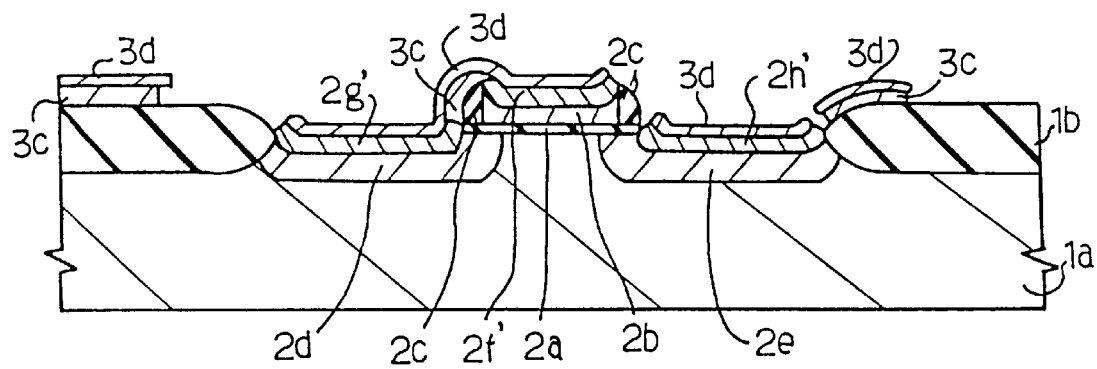
Figure 2:
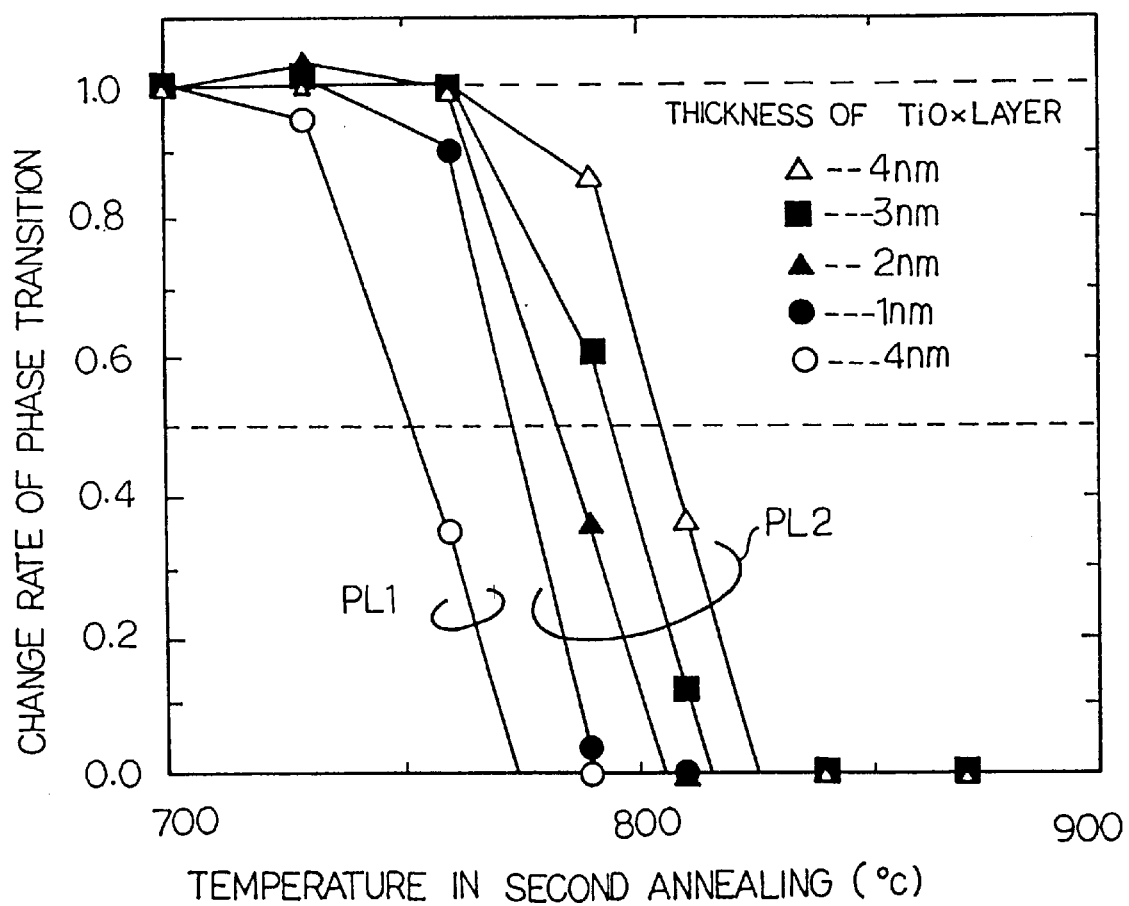
FIG. 2 is a graph showing the influence of the thickness of titanium layer and the thickness of titanium oxide layer on the relation between the change rate of phase transition and the annealing temperature.

Referring to FIGS. 3A to 3E of the drawings, a process for fabricating an n-channel MIS type field effect transistor embodying the present invention starts with preparation of a p-type silicon substrate 10a, and a thick field oxide layer 10b is selectively grown by using the LOCOS technology. The thick field oxide layer 10b defines an active area in the major surface of the silicon substrate 10a, and the active area is assigned to an n-channel MIS type field effect transistor forming a part of an integrated circuit. Boron may have been introduced under the thick field oxide layer 10b so as to form a channel stopper beneath the thick field oxide layer 10b.

The silicon in the active area is thermally oxidized, and a thin gate oxide layer 12a of 8 nanometers thick is grown on the silicon substrate 10a. Polysilicon is deposited to 100 nanometers thick over the entire surface of the resultant semiconductor structure by using a chemical vapor deposition, and a polysilicon layer extends over the thin gate oxide layer 12a and the thick field oxide layer 10b. Phosphorous is doped into the polysilicon layer, and an appropriate photo-resist etching mask (not shown) is formed on the phosphorous-doped polysilicon layer. Using the photo-resist etching mask, the phosphorous doped polysilicon layer is patterned into a polysilicon strip 12b for a gate electrode.

Silicon oxide is deposited to 100 nanometers thick over the entire surface of the resultant semiconductor structure by using a low-pressure chemical vapor deposition, and the polysilicon strip 12b and the gate oxide layer 12a are covered with a silicon oxide layer. The polysilicon strip 12b and the gate oxide layer 12a may be covered with a silicon nitride layer instead of the silicon oxide layer. The silicon oxide layer is anisotropically etched away without an etching mask by using a dry etching technique, and side wall spacers 12c are formed on both side surfaces of the polysilicon strip 12b. While the silicon oxide layer is being anisotropically etched, the thin gate oxide layer 12a on both sides of the polysilicon strip 2b are concurrently etched away, and the silicon substrate 10a is exposed to the gaps between the side wall spacers 12c and the thick field oxide layer 10b.

Arsenic is ion implanted into the resultant semiconductor structure without an ion-implantation mask at dose of $1 \times 10^{15}$ cm$^{-2}$, and is activated during an annealing at 900 degrees in centigrade. As a result, source and drain regions 12d/12e are formed in the active area.

Figure 3A:
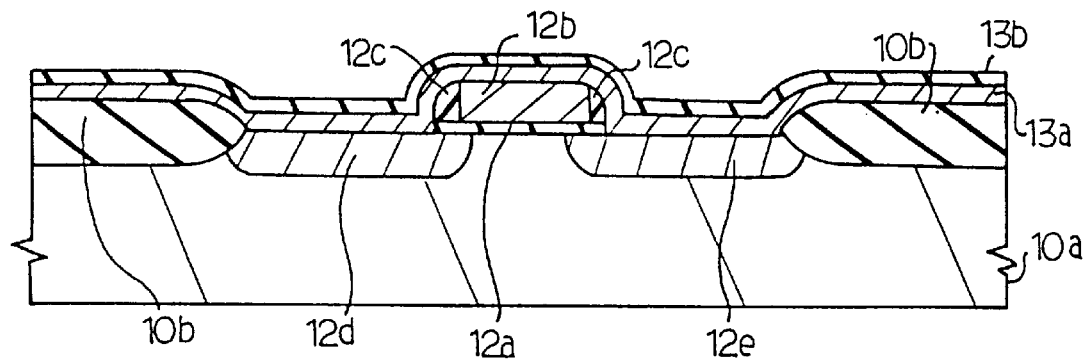
FIGS. 3A to 3E are cross sectional views showing a process of fabricating an n-channel MIS (metal-insulator-semiconductor) type field effect transistor according to the present invention.

Subsequently, titanium is deposited to 20 nanometers thick over the entire surface of the resultant semiconductor structure by using a sputtering, and a titanium layer 13a extends over the thick field oxide layer 10b, the source and drain regions 12d/12e, the side wall spacers 12c and the polysilicon strip 12b. When the resultant semiconductor structure is taken out from the sputtering system, a surface portion of the titanium layer 13a is oxidized in the atmosphere, and the titanium layer 13a is overlain by a titanium oxide layer 13b as shown in FIG. 3A. The titanium oxide layer 13b is of the order of 5 nanometers thick, and is expressed as TiO$_x$ where x ranges between 1 and 2.

Figure 3B:
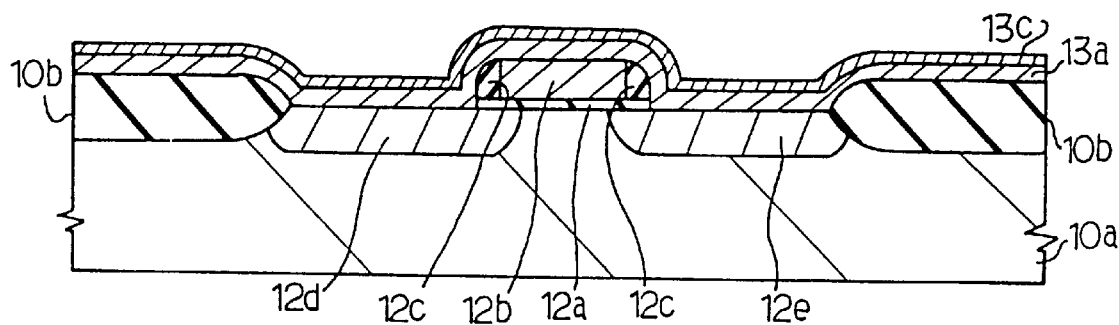

Subsequently, the resultant semiconductor structure is placed in an annealing system, and a first annealing is carried out in fluoride gas atmosphere at 300 degrees to 500 degrees in centigrade, and the titanium oxide layer 13b is converted to a titanium fluoride layer 13c as shown in FIG. 3B. Time for the first anneal ranges from 10 minutes to 30 minutes at 500 degrees. The fluoride gas atmosphere never contains nitrogen, and is created by using trifluoromethane, i.e., CHF$_3$. Trifluoromethane reacts with titanium oxide as follows.

Figure 4:
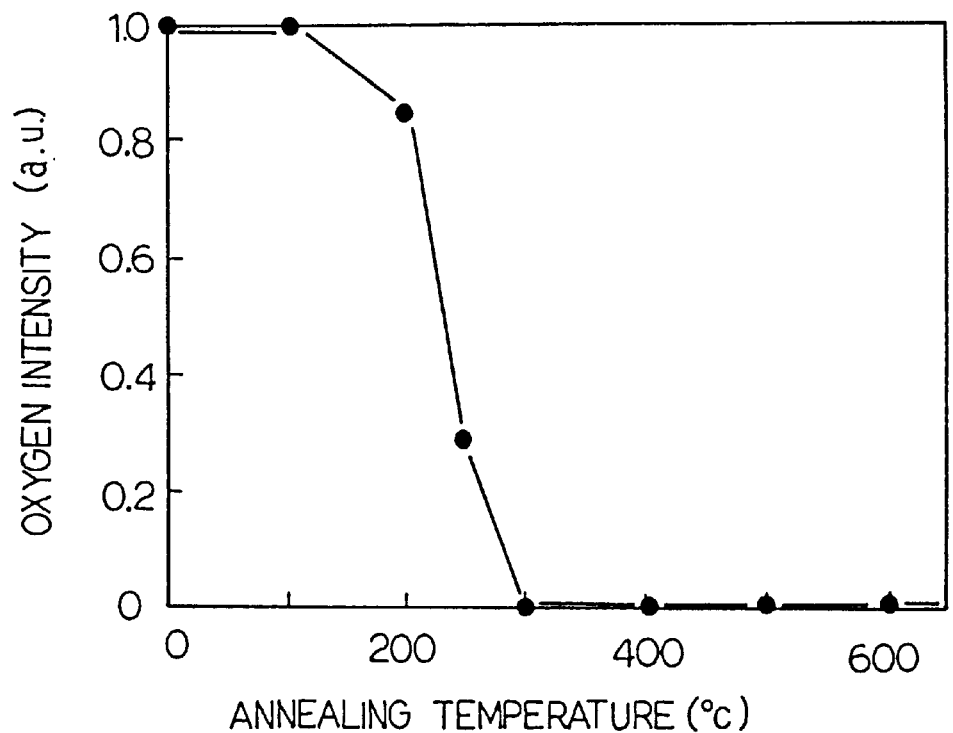
FIG. 4 is a graph showing relation between residual oxygen measured by an auger electron spectroscopy and an annealing temperature in nitrogen atmosphere.

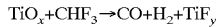

$$TiO_x + CHF_3 \rightarrow CO + H_2 + TiF_y$$

where y ranges between 3 and 4. The trifluoromethane is less stable than the titanium oxide. The fluoride gas atmosphere may be created by using another fluoro-alkane such as, for example, difluoromethane (CH$_2$F$_2$) or tetrafluoromethane (CF$_4$). Fluorocycloalkane or sulfur hexafluoride is also available for the fluoride gas atmosphere. A typical example of the fluorocycloalkane is octafluorocyclobuthane (C$_4$H$_8$). The conditions for the first annealing were determined as follows. The present inventor firstly investigated a temperature dependency of residual oxygen concentration in titanium layers by using an auger electron spectroscopy. FIG. 4 illustrated the temperature dependency of the residual oxygen. When the annealing was carried out at 300 degrees in centigrade or higher than 300 degrees in centigrade, the residual oxygen concentration was negligible. In other words, the titanium oxide was perfectly converted to the titanium fluoride, and oxygen was hardly diffused into the titanium layer.

Figure 5:
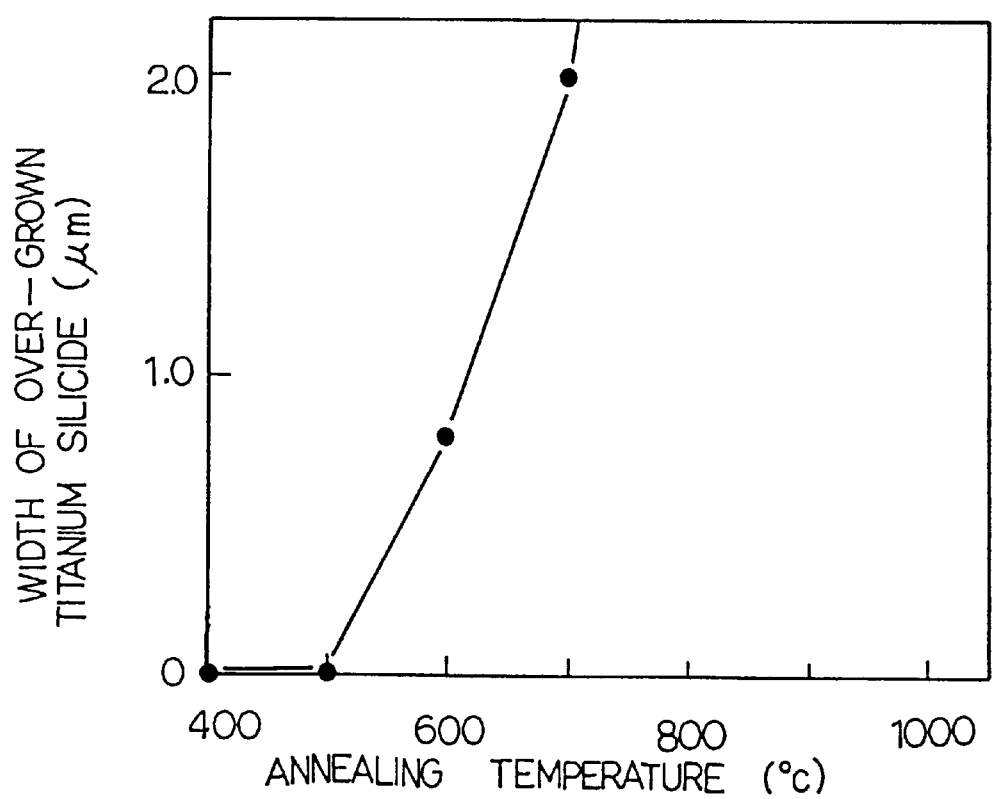
FIG. 5 is a graph showing relation between the width of an over-grown titanium silicide and an annealing temperature.

Subsequently, the present inventor investigated a temperature dependency of over-growth of titanium silicide or a temperature dependency of bridging phenomenon of titanium silicide. When the titanium layer 13a was annealed in nitrogen-free atmosphere, the titanium was liable to be converted to titanium silicide. As shown in FIG. 5, when the annealing was carried out over 500 degrees in centigrade, the titanium silicide was grown beyond the side edges of the titanium layer. The over-grown titanium silicide was causative of undesirable short-circuit. In order to prohibit a titanium silicide layer from the over-growth beyond the source/drain regions 12d/12e and the polysilicon strip 12b, it was necessary for the titanium layer 13a laminated with the titanium oxide layer 13b to be annealed at 500 degrees in centigrade or less.

As will be understood from the foregoing description, the first annealing is carried out between 300 degrees and 500 degrees in centigrade.

Figure 3C:
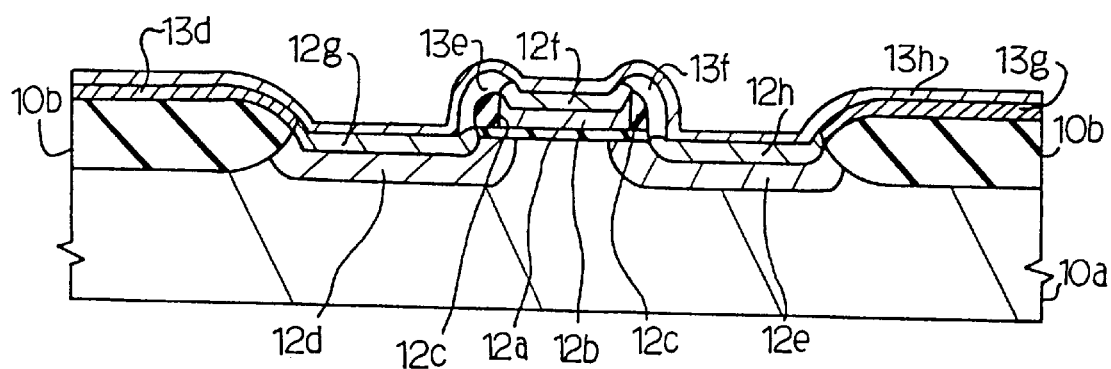

Upon completion of the first annealing, the resultant semiconductor structure is subjected to a second annealing in nitrogen ambience at 700 degrees in centigrade for 30 seconds. The titanium fluoride layer 13c is evaporated, and titanium silicide layers 12f, 12g and 12h are produced from the titanium layer 13a, a surface portion of the polysilicon strip 12b and surface portions of the source/drain regions 12d/12e in a self-aligned manner. The titanium silicide layers 12f/12g/12h have C49 crystal structure. Titanium layers 13d, 13e, 13f and 13g remain on the thick field oxide layer 10b and the wide wall spacers 12c, and the titanium silicide layers 12f to 12h and the residual titanium layers 13d to 13g are covered with a titanium nitride layer 13h as shown in FIG. 3C. As described hereinbefore, the titanium layer 13a contains a negligible amount of oxygen, and oxygen in the residual titanium layers 13d to 13g and the titanium silicide layers 12f to 12h is also negligible.

The annealing temperature of the second stage ranges from 500 degrees to 750 degrees in centigrade. Titanium monosilicide (TiSi) is less produced at over 500 degrees in centigrade. Titanium disilicide is produced in the second annealing, and has C49 crystal structure. The over-growth in the second annealing is a few percent of the over-growth in the nitrogen-free atmosphere shown in FIG. 5. However, if the annealing temperature exceeds 750 degrees in centigrade, the over-growth is non-ignoreable. For this reason, the second annealing is carried out between 500 degrees and 750 degrees in centigrade.

Figure 3D:
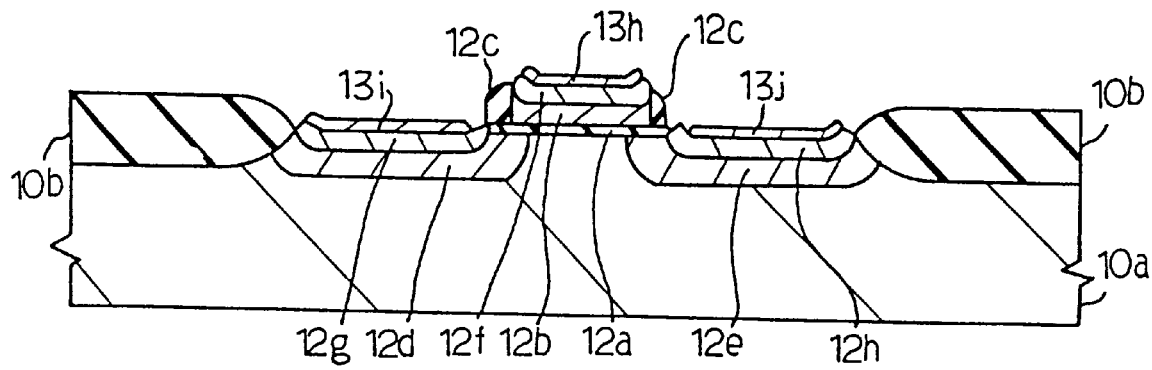

Subsequently, the residual titanium layers 13d/13e/13f/13g are etched away by using mixture of aqueous ammonia, pure water and hydrogen peroxide, and the titanium nitride layer 13h over the residual titanium layers 13d to 13g are lifted off. As a result, only the titanium silicide layers 12f/12g/12h and the titanium nitride layers 13h/13i/13j are left on the polysilicon strip 12b and the source and drain regions 12d/12e as shown in FIG. 3D. The titanium layers 13d to 13g are oxygen-free, and the etchant has a large selectivity to the oxygen-free titanium layers 13d to 13g. This is the reason why the residual titanium is perfectly removed. A short-circuit and/or leakage current do not take place in the n-channel MIS type field effect transistor.

Figure 3E:
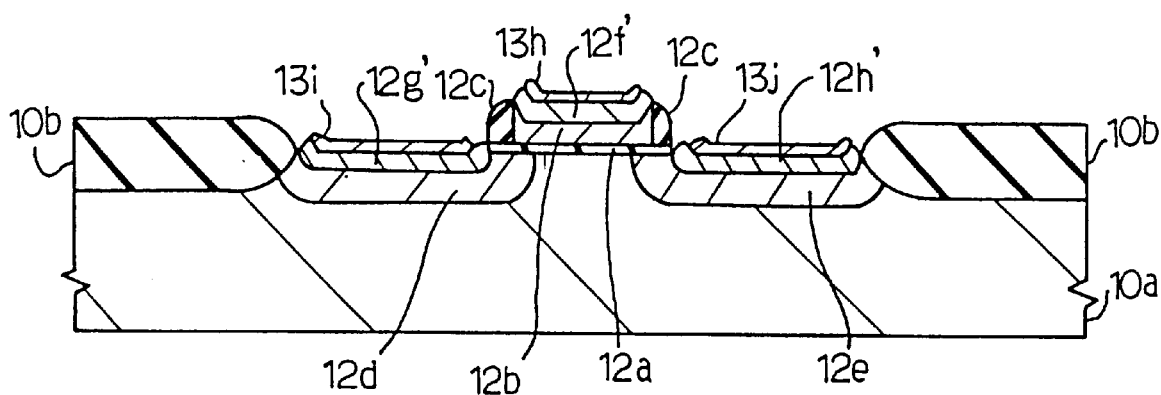

Finally, a third annealing is carried out at 800 degrees in centigrade in the nitrogen atmosphere at the atmospheric pressure for 60 seconds. The titanium silicide layers are converted from the high-resistive C49 crystal structure 12f to 12h to low-resistive C54 crystal structure 12f'/12g'/12h' as shown in FIG. 3E.

The titanium silicide layers 12f to 12h are oxygen-free, and, for this reason, the titanium silicide layers 12f to 12h are converted from C49 crystal structure to C54 crystal structure at a phase transition temperature lower than that of the prior art. Thus, the third annealing is carried out with a large margin between the phase transition temperature and the aggregation temperature, and undesirable discontinuity does not take place in C54 crystal structure. This result in low-resistive two-layered signal propagation paths 12f'/12b, 12g'/12d and 12h'/12e.

As will be appreciated from the foregoing description, undesirable short-circuit and leakage do not take place in the n-channel MIS type field effect transistor fabricated through the process according to the present invention, and the two-layered signal propagation paths 12f'/12b, 12g'/12d and 12h'/12e achieve low resistance.

Second Embodiment

Figure 6A:
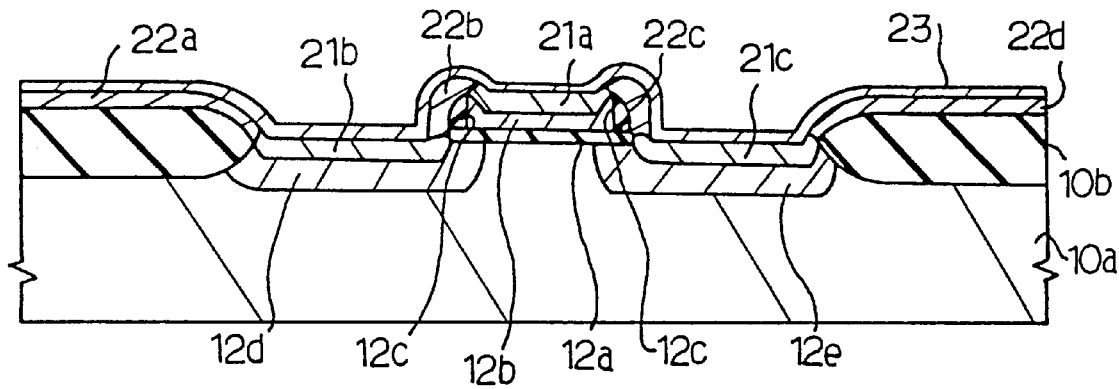
FIGS. 6A to 6C are cross sectional views showing another process of fabricating an n-channel MIS type field effect transistor.
Figure 6B:
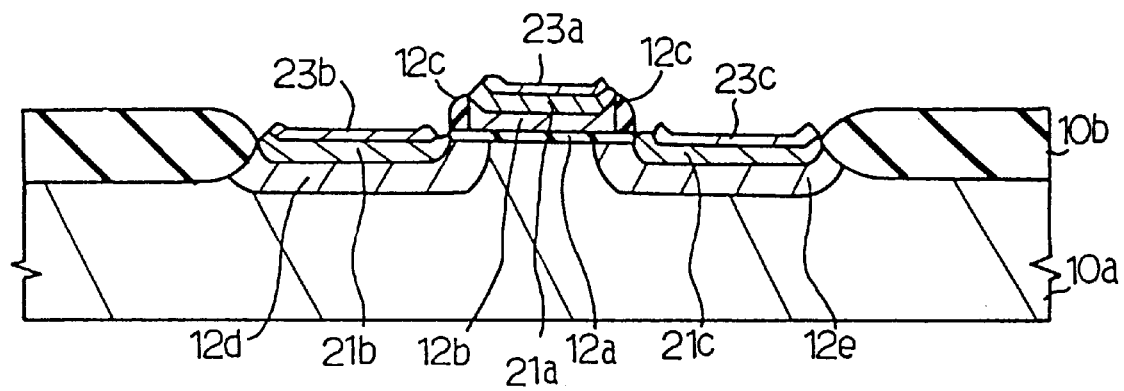
Figure 6C:
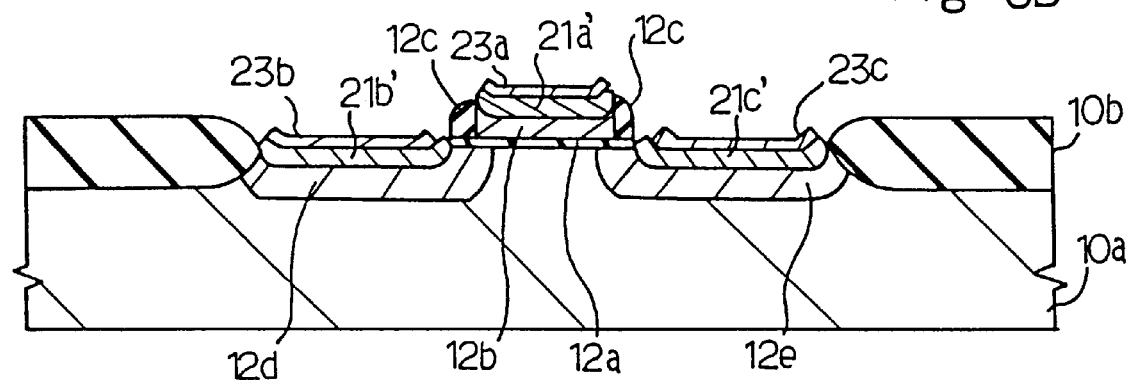

FIGS. 6A to 6C illustrates another process for fabricating an n-channel MIS type field effect transistor embodying the present invention. The process implementing the second embodiment is similar to the first embodiment until the resultant semiconductor structure is taken out from the sputtering system. For this reason, layers and regions of the resultant structure shown in FIGS. 6A to 6C are labeled with the same references as those designating the corresponding layers and the regions shown in FIG. 3A.

The resultant semiconductor structure is firstly annealed in gaseous mixture containing both nitrogen gas and fluoride gas at 700 degrees in centigrade for 30 seconds. The annealing in this stage may be carried out at 500 degrees to 750 degrees in centigrade, and the reason for the temperature range is analogous to the second annealing in the first embodiment. In this instance, the sulfur hexafluoride ($SF_6$) is used as the fluoride gas.

While the first annealing is being carried out, the titanium oxide layer is converted to a titanium fluoride layer, and the titanium fluoride layer is evaporated. Moreover, the titanium layer reacts with the silicon, and titanium silicide layers 21a/21b/21c are produced in a self-aligned manner with the polysilicon strip 12b and the source/drain regions 12d/12e. The titanium silicide layers 21a/21b/21c have C49 crystal structure. Residual titanium layers 22a, 22b, 22c and 22d remain on the thick field oxide layer 10b and the side wall spacers 12c. The titanium silicide layers 21a to 21c and the residual titanium layers 22a to 22d are covered with a titanium nitride layer 23 as shown in FIG. 6A.

The titanium oxide layer is evaporated after the conversion to the titanium fluoride, and oxygen is hardly diffused into the titanium silicide layers 21a to 21c and the residual titanium layers 22a to 22d. Thus, the oxygen-free titanium silicide layers 21a to 21c and the oxygen-free titanium layers 22a to 22d are obtained through only one annealing. In order to concurrently achieve all the reactions described above during the single annealing, it is recommendable to regulate the fluoride gas content and the nitrogen content to 10 percent to 99 percent by atom and 1 percent to 99 percent by atom, respectively.

In this instance, sulfur hexafluoride is used as the fluoride gas. However, the fluoro-alkane such as $CHF_3$, $CH_2F_2$ and $CF_4$ and the fluorocycloalkane such as $C_4H_8$ are available for the gaseous mixture.

Subsequently, the residual titanium layers 22a/22b/22c/22d are etched away by using mixture of aqueous ammonia, pure water and hydrogen peroxide, and the titanium nitride layer 23 over the residual titanium layers 22a to 22d are lifted off. As a result, only the titanium silicide layers 21a/21b/21c and the titanium nitride layers 23a/23b/23c are left on the polysilicon strip 12b and the source and drain regions 12d/12e as shown in FIG. 6B. The titanium layers 13d to 13g are substantially oxygen-free, and the etchant has a large selectivity to the oxygen-free titanium layers 22a to 22d. For this reason, a short-circuit and/or leakage current do not take place in the n-channel MIS type field effect transistor.

Finally, a second annealing is carried out at 800 degrees in centigrade in the nitrogen ambience at the atmospheric pressure for 60 seconds. The titanium silicide layers are converted from the high-resistive C49 crystal structure 21a to 21c to low-resistive C54 crystal structure 21a'/21b'/21c' as shown in FIG. 6C.

The titanium silicide layers 21a to 21c are substantially oxygen-free, and, for this reason, the titanium silicide layers 21a to 21c are converted from C49 crystal structure to C54 crystal structure at a phase transition temperature lower than that of the prior art. Thus, the second annealing is carried out with a large margin between the phase transition temperature and the aggregation temperature, and undesirable discontinuity does not take place in C54 crystal structure. This result in low-resistive two-layered signal propagation paths 21a'/12b, 21b'/12d and 21c'/12e.

As will be appreciated from the foregoing description, the process implementing the second embodiment achieves all the advantages of the first embodiment through a simple process sequence.

Evaluation of Titanium Silicide

The present inventor evaluated the titanium silicide layers produced through the processes according to the present invention. The present inventor formed first samples of the titanium silicide layer produced through the process shown in FIGS. 3A to 3E, second samples of the titanium silicide layer produced through the process shown in FIGS. 6A to 6C and third samples of the titanium silicide layer produced through the prior art process. The first, second and third samples had a variation in width.

Figure 7:
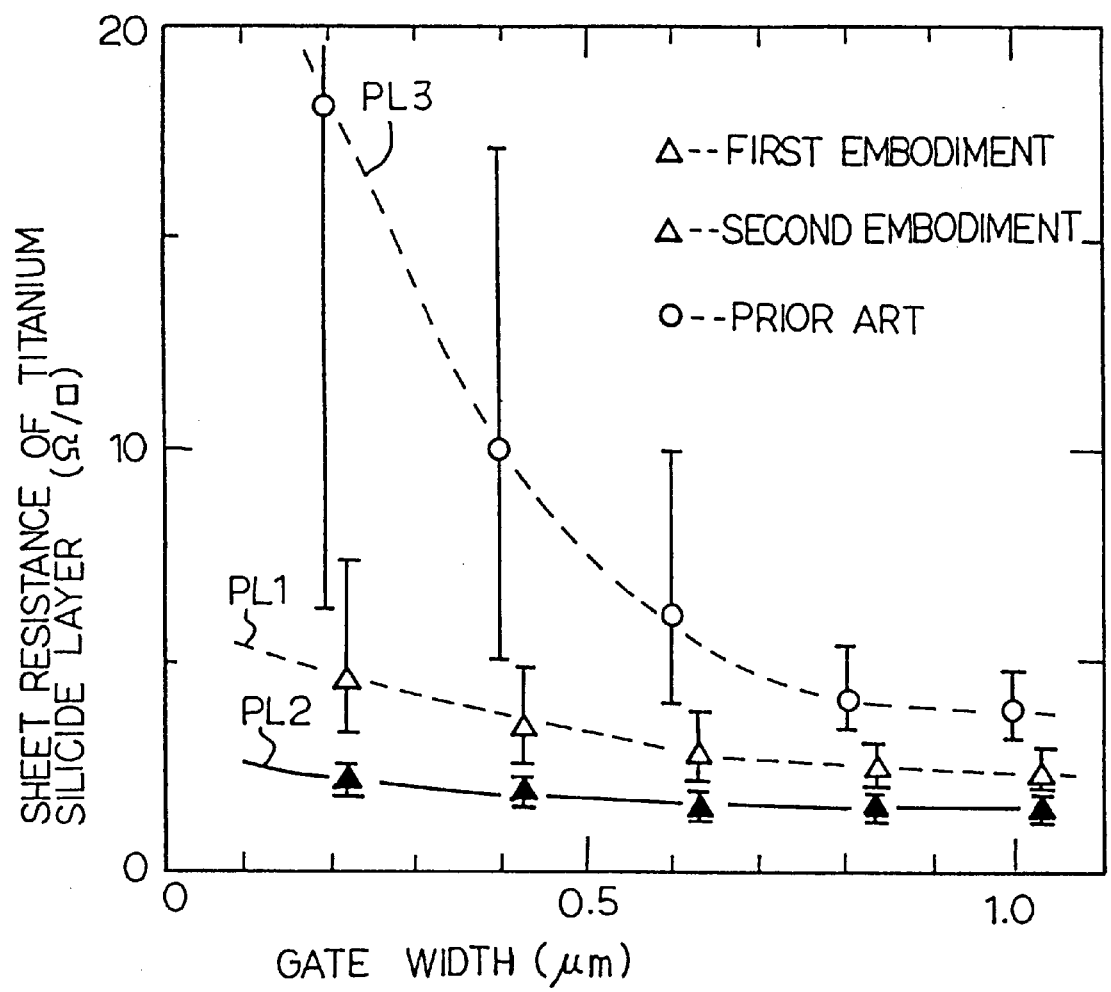
FIG. 7 is a graph showing sheet resistance of titanium silicide layers produced through the processes according to the present invention and the prior art process.

The present inventor measured the sheet resistance of the first to third samples, and the sheet resistance was plotted in FIG. 7. Plots PL1, plots PL2 and plots PL3 represented the sheet resistance of the first, second and third samples. Comparing plots PL1 and PL2 with plots PL3, it was understood that the present invention not only lowered the sheet resistance but also decreased the dispersion of the sheet resistance. The technical advantages were derived from the suppression of aggregation and the decrease of the oxygen content.

Comparing plots PL1 with plots PL2, the second samples were further improved in the sheet resistance and the dispersion rather than the first samples. The present inventor concluded that the process shown in FIGS. 6A to 6C was more desirable rather than the process shown in FIGS. 3A to 3E.

Although particular embodiments of the present invention have been shown and described, it will be obvious to those skilled in the art that various changes and modifications may be made without departing from the spirit and scope of the present invention.

For example, the n-channel MIS type field effect transistor may be formed in a p-type well, and a p-channel MIS type field effect transistor may be formed on an n-type silicon substrate or an n-type well.

An isolation trench filled with insulator may define the active area assigned to the n-channel MIS type field effect transistor.

The present invention is applicable to any kind of semiconductor device such as, for example, a bi-MOS circuit or a CMOS circuit.

What is claimed is:

1. A process of fabricating a semiconductor device comprising the steps of:

a) preparing a semiconductor structure having at least one silicon layer and an insulating layer;

b) covering said silicon layer and said insulating layer with a titanium layer, said titanium layer being unintentionally oxidized so as to be coated with a titanium oxide layer;

c) annealing the resultant structure of said step b) in a first atmosphere containing fluoride gas so as to evaporate titanium fluoride produced from said titanium oxide layer and to produce an oxygen-free high-resistive titanium silicide layer from said titanium layer in a self-aligned manner with said silicon layer;

d) removing residual titanium on said insulating layer from the resultant structure of said step c); and e) annealing the resultant structure of said step d) in a second atmosphere higher than said first ambience so as to convert said oxygen-free high-resistive titanium silicide layer to an oxygen-free low-resistive titanium silicide layer.

2. The process as set forth in claim 1, in which said step c) includes the sub-steps of c-1) annealing said resultant structure in nitrogen-free fluoride gas atmosphere so as to convert said titanium oxide layer to said titanium fluoride covering an oxygen-free titanium layer, c-2) annealing the resultant structure of said step c-1) in nitrogen atmosphere so as to evaporate said titanium fluoride, to produce said oxygen-free high-resistive titanium silicide layer from said oxygen-free titanium layer and to form a titanium nitride layer covering said oxygen-free high-resistive titanium silicide layer and said residual titanium, said titanium nitride layer being removed together with said residual titanium in said step d).

3. The process as set forth in claim 2, in which said nitrogen-free fluoride gas atmosphere contains material selected from the group consisting of fluoro-alkane, fluoro-cyclo-alkane and sulfur hexafluoride.

4. The process as set forth in claim 3, in which said fluoro-alkane is one of trifluoro-methane, difluoro-methane and tetrafluoro-methane.

5. The process as set forth in claim 3, in which said fluoro-cyclo-alkane is octafluoro-cyclo-buthane.

6. The process as set forth in claim 2, in which said annealing in said step c-1) is carried out at 300 degrees to 500 degrees in centigrade.

7. The process as set forth in claim 2, in which said annealing in said step c-2) is carried out at 500 degrees to 750 degrees in centigrade.

8. The process as set forth in claim 1, in which said first atmosphere further contains nitrogen gas so as to cover said oxygen-free high-resistive titanium silicide layer and a layer of said residual titanium with a titanium nitride layer, and a part of said titanium nitride layer is removed together with said layer of said residual titanium in said step d).

9. The process as set forth in claim 8, in which said fluoride gas is a material gas selected from the group consisting of fluoro-alkane, fluoro-cyclo-alkane and sulfur hexafluoride gas.

10. The process as set forth in claim 9, in which said annealing in said step c) is carried out at 500 degrees to 750 degrees in centigrade.

11. The process as set forth in claim 1, in which said annealing in said step e) is carried out at 800 degrees in centigrade.

12. A process of fabricating a semiconductor device comprising the steps of:

a) preparing a semiconductor structure having a gate electrode, source and drain regions, a field oxide layer and side wall spacers;

b) covering said gate electrode, said source and drain regions, said field oxide layer and said side wall spacers with a titanium layer, said titanium layer being unintentionally oxidized so as to be coated with a titanium oxide layer;

c) annealing the resultant structure of said step b) in nitrogen-free fluoride gas atmosphere at 300 degrees to 500 degrees in centigrade so as to convert said titanium oxide layer to a titanium fluoride layer covering an oxygen-free titanium layer;

d) annealing the resultant structure of said step c) in nitrogen atmosphere at 500 degrees to 750 degrees in centigrade so as to evaporate said titanium fluoride layer, to produce oxygen-free high-resistive titanium silicide layers from said oxygen-free titanium layer in a self-aligned manner with said gate electrode and said source and drain regions and to form a titanium nitride layer covering said oxygen-free high-resistive titanium silicide layer and residual titanium layers left on said thick field oxide layer and said side wall spacers;

e) removing said residual titanium layers from the resultant structure of said step d) together with said titanium nitride layer; and f) annealing the resultant structure of said step e) in a nitrogen atmosphere higher than said nitrogen atmosphere in said step d) so as to convert said oxygen-free high-resistive titanium silicide layer to an oxygen-free low-resistive titanium silicide layer.

13. A process of fabricating a semiconductor device comprising the steps of:

a) preparing a semiconductor structure having a gate electrode, source and drain regions, a field oxide layer and side wall spacers;

b) covering said gate electrode, said source and drain regions, said field oxide layer and said side wall spacers with a titanium layer, said titanium layer being unintentionally oxidized so as to be coated with a titanium oxide layer;

c) annealing the resultant structure of said step b) in an atmosphere containing fluoride gas and nitrogen gas so as to evaporate titanium fluoride produced from said titanium oxide, to produce oxygen-free high-resistive titanium silicide layers in a self-aligned manner with said gate electrode and said source and drain regions and to cover said oxygen-free high-resistive titanium silicide layers and residual titanium layers on said field oxide layer and said side wall spacers with a titanium nitride layer;

d) annealing the resultant structure of said step c) in nitrogen atmosphere at 500 degrees to 750 degrees in centigrade so as to evaporate said titanium fluoride layer, to produce oxygen-free high-resistive titanium silicide layers from said oxygen-free titanium layer in a self-aligned manner with said gate electrode and said source and drain regions and to form a titanium nitride layer covering said oxygen-free high-resistive titanium silicide layer and residual titanium layers left on said thick field oxide layer and said side wall spacers, e) removing said residual titanium layers from the resultant structure of said step d) together with parts of said titanium nitride layer on said residual titanium layers; and f) annealing the resultant structure of said step e) in a nitrogen atmosphere higher than said ambience in said step d) so as to convert said oxygen-free high-resistive titanium silicide layer to an oxygen-free low-resistive titanium silicide layer.

* * * * *